United States Patent [19]
Sherwin

[11] Patent Number: 5,914,497
[45] Date of Patent: Jun. 22, 1999

[54] TUNABLE ANTENNA-COUPLED INTERSUBBAND TERAHERTZ (TACIT) DETECTOR

[76] Inventor: Mark Sherwin, 931 W. Campus La., Goleta, Calif. 93117

[21] Appl. No.: 08/892,629

[22] Filed: Jul. 14, 1997

[51] Int. Cl.⁶ .................. H01L 31/0232; H01L 31/0304; H01L 31/0224; H01L 31/112
[52] U.S. Cl. .......................... 257/21; 257/194; 257/195; 257/257; 257/294; 257/275
[58] Field of Search ................................ 257/21, 20, 187, 257/188, 189, 194, 257, 294, 432, 459, 449, 436, 275, 195

[56] References Cited

U.S. PATENT DOCUMENTS

| 4,814,836 | 3/1989 | Thompson | 257/257 |
|---|---|---|---|
| 5,459,343 | 10/1995 | Seymour et al. | 257/275 |
| 5,640,026 | 6/1997 | Terazono | 257/194 |

*Primary Examiner*—Jerome Jackson, Jr.
*Attorney, Agent, or Firm*—Daniel L. Dawes

[57] ABSTRACT

A tunable antenna-coupled intersubband terahertz (TACIT) detector is based on intersubband absorption in doped semiconductor quantum wells. THz-frequency radiation impinges on a coplanar antenna. The antenna couples radiation into a narrow constriction in a two dimensional electron gas (the "active region") with electric field perpendicular to the plane of the antenna. Radiation, which is at the intersubband absorption frequency, is absorbed in the active region. The resulting change in resistance through the constriction is detected. The frequency of the absorption, and hence the detection frequency, can be tuned over the 1–5 THz range by applying small voltages between a front and back gate. The efficiency with which radiation couples from the antenna into the active region can be optimized at each frequency.

TACIT detectors solve a number of outstanding problems associated with Terahertz detection including:
1. Voltage tunability eliminates the need for bulky spectrometers and interferometers in certain applications.
2. Superior combination of speed and sensitivity.
3. Relaxed cooling requirements.

18 Claims, 9 Drawing Sheets

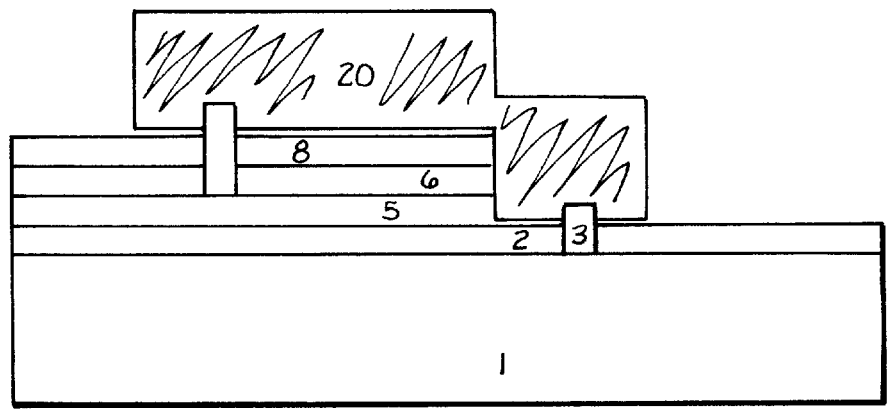
Fig. 6e
Fig. 6f
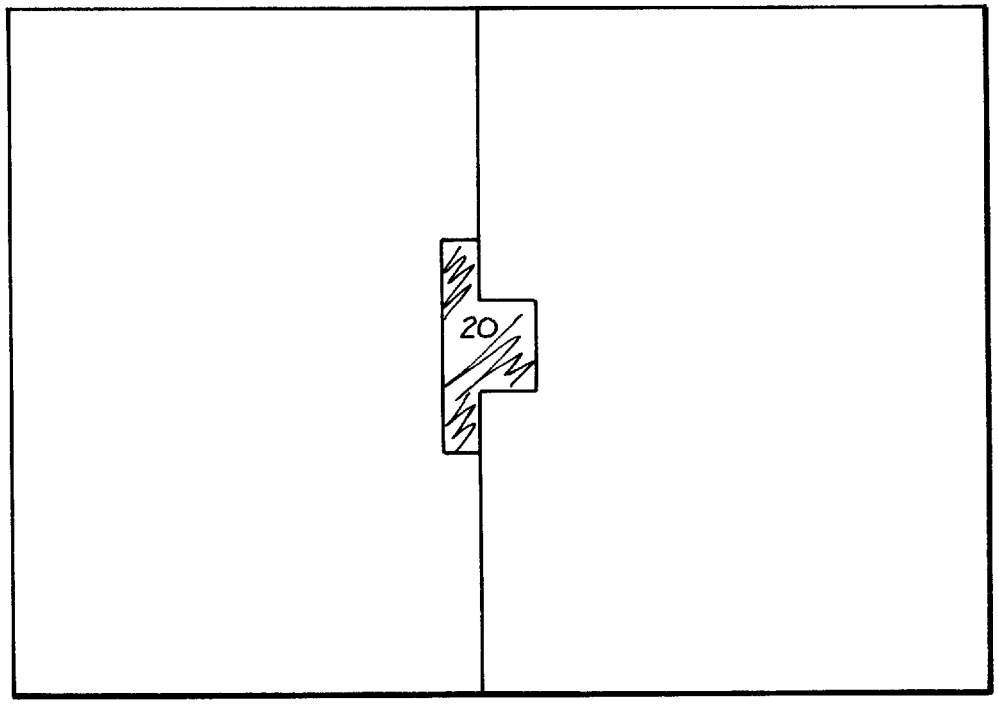

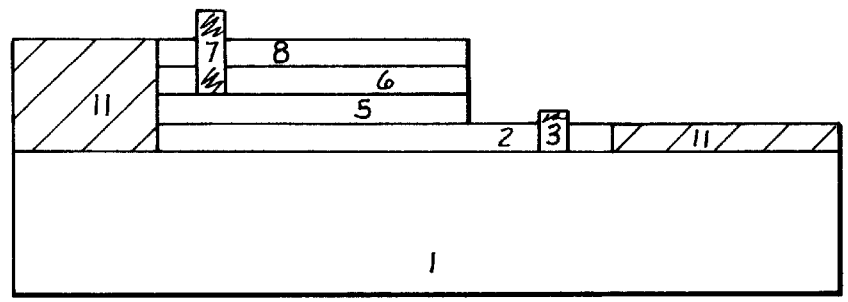
Fig. 6g
Fig. 6h
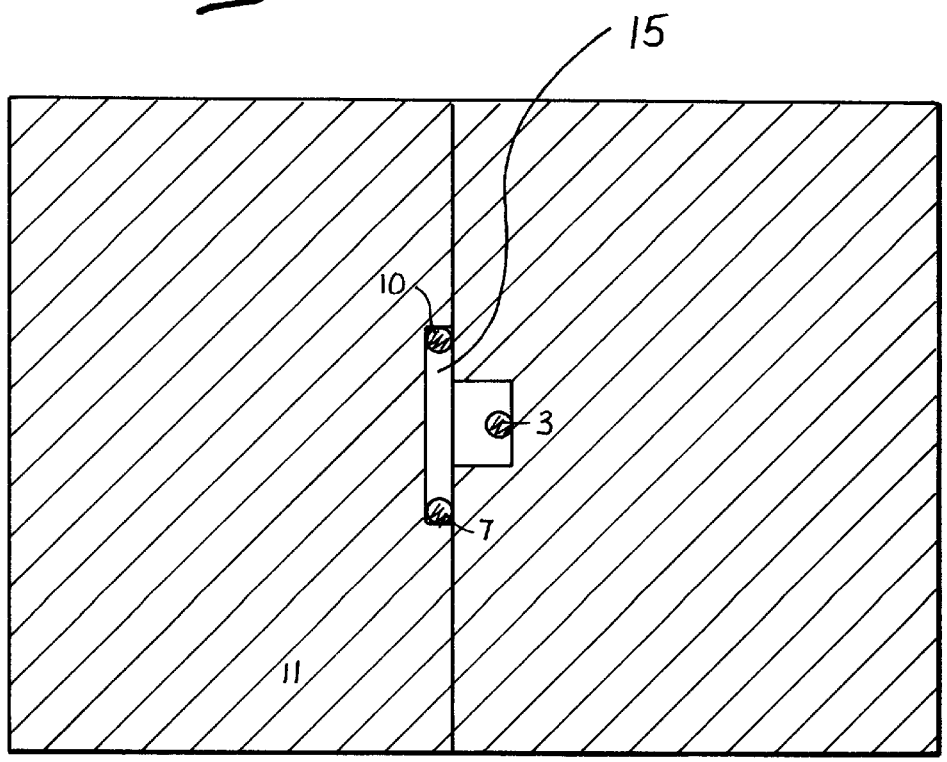

TUNABLE ANTENNA-COUPLED INTERSUBBAND TERAHERTZ (TACIT) DETECTOR

The invention may be subject to Government rights as defined in contract N00016-K-0692 of the Office of Naval Research; DAAL03-G-0287 of the U.S. Army Research Office; DMR 96-23874 of the National Science Foundation; 88-0099 of the Air Force Office of Scientific Research; and DMR 91-20007 of the NSF Science and Technology Center for Quantized Electronic Structures.

BACKGROUND OF INVENTION

1. Field of the Invention

The present invention relates to an electromagnetic wave detector made of semiconductor material with a quantum well structure. The detector operates optimally in the range of frequencies between 1 and 5 Terahertz (THz) (corresponding to wavelengths between 300 and 60 microns) although operation at higher or lower frequencies is included.

2. Description of the Prior Art

Semiconductor epitaxy enables one to grow adjacent layers of semiconductor with different band gaps. FIGS. 1 $a$–$d$ show a few examples of the kinds of quantum wells that can be grown using semiconductor epitaxy. The solid lines represent the energy of the conduction band as a function of position, which is proportional to the concentration x of Al in $Al_xGa_{1-x}As$. The dashed lines represent the energy levels, or subbands, that are allowed for an electron occupying the various quantum wells. The lowest subband is called the ground state. Higher lying subbands are called excited states. FIG. 1(A) shows a relatively narrow square well in which the two lowest subbands are separated by a relatively large energy. FIG. 1(B) shows a wider square well in which the two lowest subbands are separated by a much smaller energy. FIG. 1(C) shows two square wells which are coupled to each other by tunneling through a thin barrier. In this well, the first two subbands are separated by an energy small compared to the spacing between second and third subbands. FIG. 1(D) shows a quantum well in which the band gap is continuously graded over the width of the quantum well.

The promotion of an electron from one subband to another is called an intersubband transition. A photon can induce an intersubband transition if its frequency matches the spacing between the ground state and first excited state. It is possible to place electrons in quantum wells by adding impurities to, or doping the semiconductor. FIG. 2A shows a doped quantum well, in which the impurities have been added in the region of low band gap (for example, GaAs). This has the advantage of being simple but the disadvantage that the electrons scatter off the impurities as they move through the quantum well. FIG. 2B shows a remotely-doped quantum well, in which the impurities are placed in a region with high band gap fairly close to the quantum well. The electrons populate the well because that is the region where they have the least potential energy. In a remotely-doped quantum well, the electron-impurity scattering is much weaker than in a doped quantum well.

Semiconductor epitaxy offers the opportunity to design improved detectors for THz radiation. The potential of epitaxy has been realized in the mid-ranges of infrared (2–18 $\mu$m wavelengths) by quantum well infrared photoconductors (QWIPs). See B. F. Levine et.al., "[New 10 mu m infrared detector using intersubband absorption in resonant tunneling GaAlAs superlattices]," Applied Physics Letters 50 (16), 1092–4 (1987). In a QWIP a photon which is resonant with an intersubband transition promotes an electron e to an excited state, and that electron is collected as shown in the energy diagram of FIG. 3. Bois et. al. "Electromagnetic Wave Detector with Quantum Well Structure.", U. S., Pat. No. 5,506,418, (1996) describes a two-terminal bolometer based on intersubband transitions (ISBTs). The ability to tune the intersubband absorption frequency by applying a voltage between gate and drain has been demonstrated by Heyman et. al. "Resonant harmonic generation and dynamic screening in a double quantum well," Physical Review Letters 72 (14), 2183–6 (1994) and is shown in FIG. 4. A tuning range of up to a factor of four has been achieved. The ability to place a "back gate" on a sample, which is a conducting layer between quantum well and substrate, has been proven by Hopkins et. Al. "Logarithmically graded quantum well far-infrared modulator," Applied Physics Letters 64 (3), 348–50 (1994). Hopkins et. al. have also demonstrated the disposition of a layer of so-called low-temperature grown (LT) GaAs between the back gate and the quantum well in order to electrically isolate the quantum well from the back-gate. LT GaAs is insulating by virtue of a high concentration of defects. It is also possible to isolate the back gate from the quantum well with a layer of semi-insulating GaAs, which is grown at a temperature near 200° C., followed by annealing near 600° C. After the annealing process, an LT-GaAs layer contains inclusions of As. It is thought 20 that these inclusions result in its highly insulating character. It is also possible to isolate the back gate from the quantum well with an epitaxial layer of semi-insulating $Al_xGa_{1-x}As$, which is insulating by virtue of being not intentionally doped, thus having a low carrier concentration of impurities and free carriers.

Several antenna-coupled detectors for THz radiation based on semi-conductors have been proposed. Norton, "Integrated IR and MM-Wave Detector", U.S. Pat. No. 5,432,374 (1995) has proposed an antenna-coupled FET. In this detector, "mm-wavelength radiation that is received by the antenna structure causes a modulation of current flow between source and drain." Fedichkin et.al. "A novel tunable infrared detector based on a quantum ballistic channel," Infrared Physics 34 (5), 477–80 (1993) have proposed an antenna coupled to a quantum point contact, yielding a voltage tunable detector for THz radiation. See also, B.Xing et.al., "Novel voltage-tunable far-infrared and terahertz detector based on a quantum ballistic channel," Semicond. Sci. Technol. 10, 1139 (1995). Keay et al. "Dynamic localization, absolute negative conductance, and stimulated, multiphoton emission in sequential resonant tunneling semiconductor superlattices," Physical Review Letters 75 (22), 4102–5 (1995) have demonstrated an antenna-coupled diode in which radiation received by the antenna is driven through the diode, and the resulting rectified voltage or current is detected.

The detectors of radiation which prior to the present invention exhibited the best combination of speed and sensitivity over a broad band of frequencies near the THz range are superconducting hot-electron bolometers. See A. Skalare et.al. "Large bandwidth and low noise in a diffusion-cooled hot-electron bolometer mixer," Applied Physics Letters 68 (11), 1558–60 (1996). Skalare demonstrates that it is well known within the art to use a hot-electron bolometer as a mixer. Operated as mixers, these detectors have reached noise temperatures of 650 K, which is approximately 25 times the fundamental limit $h\upsilon/k_B$ imposed by quantum mechanics at 533 GHz with an IF bandwidth of 1.7 GHz corresponding to a response time of 100 psec.

In the Terahertz frequency range, frequency resolution is usually obtained using some sort of mechanical spectrometer or interferometer, such as a Michelson or a Fabry-Perot interferometer, in combination with a detector which is sensitive over a broad band of frequencies.

Notwithstanding the foregoing prior art there is much room for improvement in detectors and spectrometers for Terahertz radiation. Outstanding problems include:

(1) the Bulk, weight, and complexity of spectrometers: Typical spectrometers add unwanted bulk, weight and complexity to space-based and other nonlaboratory applications.

(2) Coupling efficiency: A critical problem with all antenna- or waveguide-coupled detectors is to maximize the efficiency of coupling to the absorbing region. This is accomplished by matching the impedance of the absorbing region to that of the antenna. In superconducting hot-electron bolometers, the impedance of the absorbing region is fixed upon fabrication. Some electrical network is required to match the impedance of the antenna to the impedance of the bolometer. See for example the prior art impedance transforming element for a superconducting bolometer shown by J. Mees et.al., "New designs for antenna-coupled superconducting bolometers," Applied Physics Letters 59 (18), 2329–31 (1991). For a particular matching network, impedance-matching is achieved only over a narrow band of frequencies.

(3) Overloading by background radiation: Detectors which are sensitive and detect over a broad range of frequencies, for example, superconducting hot-electron bolometers, can be easily saturated by unwanted background signals which occur at frequencies different from the frequency of the desired signal.

(4) Cooling: All sensitive detectors of Terahertz-frequency radiation must be cooled to reduce the effects of thermal fluctuations. The amount of cooling required to reach the sensitivity required for a given application is a critical consideration for that application.

(5) Combining high speed and high sensitivity: There is usually a trade-off between high speed and high sensitivity. For example, the most sensitive bolometers have noise-equivalent powers (NEPs) of order 10–16 W/Hz$^{1/2}$ and time constants of several milliseconds. See, D. C. Alsop, et.al. "Design and construction of high-sensitivity, infrared bolometers for operation at 300 mK," Applied Optics 31 (31), 6610–15 (1992). For many applications, it is essential to have a detector with both high speed and high sensitivity.

What is needed is a detector which overcomes each of the foregoing shortcomings.

BRIEF SUMMARY OF INVENTION

The invention is a detector of electromagnetic radiation comprising an insulating semiconductor substrate and a conducting back gate disposed on the semiconductor substrate and having a back gate contact. An antenna provided for receiving the electromagnetic radiation has at least two leaves. The back gate is coupled by the ohmic contact to one of the two leaves of the antenna. A first insulating layer is disposed on the back gate. An absorbing layer is disposed on the first insulating layer. A source contact and a drain contact are coupled to the absorbing layer. A second insulating layer is disposed on the absorbing layer. A front gate is disposed on the second insulating layer. The front gate is coupled to a second one of the two leaves of the antenna and is disposed between source and drain contacts. As a result, a tunable antenna-coupled intersubband TeraHertz detector is provided. There are many ways that the preferred embodiment of the invention can be fabricated. One such method is the following:

(1) The following epitaxial layers are deposited by molecular beam epitaxy on a semi-insulating GaAs wafer:

500 Angstroms of nominally pure GaAs. Hereafter, layers will be assumed to be nominally pure unless otherwise noted.

800 Angstroms of $Al_{0.3}Ga_{0.7}As$.

(a) A back-gate comprising:

A remote Si doping layer for the back gate containing a total sheet density of $5 \times 10^{11}$ cm$^{-2}$ 100 Angstroms of $Al_{0.3}Ga_{0.7}As$.

85 Angstroms of GaAs. This will form the remotely-doped quantum well back gate.

100 Angstroms of $Al_{0.3}Ga_{0.7}As$.

A remote Si doping layer for the back gate containing a total sheet density of $5 \times 10^{11}$ cm$^{-2}$ (b) The first insulating layer comprising:

4200 Angstroms of $Al_{0.3}Ga_{0.7}As$.

A remote Si doping layer for the quantum well in the absorbing region containing a total sheet density of $5 \times 10^{11}$ cm$^{-2}$.

700 Angstroms of $Al_{0.3}Ga_{0.7}As$.

(c) An absorbing region comprising a single period of a remotely-doped double quantum well.

85 Angstroms of GaAs

25 Angstroms of $Al_{0.3}Ga_{0.7}As$.

75 Angstroms of GaAs.

(d) second insulating layer comprising:

700 Angstroms of $Al_{0.3}Ga_{0.7}As$.

A remote Si doping layer for the quantum well in the absorbing region and to fill surface states containing a total sheet density of $10^{12}$ cm$^{-2}$ 1300 Angstroms of $Al_{0.3}Ga_{0.7}As$.

100 Angstroms of GaAs (2) The wafer with the epitaxial layers above is patterned and treated in the following way. Standard photolithography and either wet or dry etching are used to define the patterns.

A step is formed at one edge of the active region. On one side of the step, all the epitaxial layers described above are retained. On the other side of the step, the second insulating layer, the absorbing layer, and part of the first insulating layer are removed. The back gate is not removed on either side of the step.

Standard Au/Ge/Ni/Au ohmic contacts for the back gate, source and drain are defined by photolithography, deposited, and annealed.

A 1 micron thick gold layer is evaporated over a contiguous region including the source, drain, and back-gate contacts The wafer with the gold layer is implanted with protons. The purpose of the protons is to render the absorbing layer and back gate layer insulating everywhere except under the gold layer.

The gold layer is removed.

A front gate, a gold bowtie antenna, electrical connections between one of the leaves of the antenna and the front gate, electrical connection between the second leaf and the back-gate ohmic contact, and electrical connections to the source and drain ohmic contacts are defined by photolithography and evaporated.

Alternative embodiments are also envisioned. A few of these will be described by listing alternative embodiments of the various layers, structures and processes described above, with the understanding that a very large number of alternative embodiments of the invention can be made by combining different alternatives for individual layers, structures and processes.

The first insulating layer may be made of a semiconductor which is not an intentionally doped semiconductor, (for example, $Al_{0.3}Ga_{0.7}As$), which is insulating by virtue of being undoped and having a low concentration of impurities, as shown in the above embodiment. In another embodiment, the first insulating layer is made of a material like low-temperature-grown GaAs, which is insulating by virtue of having a high concentration of structural defects.

In the embodiment shown above, the back gate is made of a modulation-doped quantum well. In another embodiment, the back gate is a doped quantum well, or a doped layer of semiconductor like n+GaAs.

In the embodiment shown above, the absorbing layer is composed of a modulation-doped quantum well. In another embodiment, the absorbing layer is composed of a doped quantum well.

In the embodiment shown above, the absorbing layer contains a single period of a coupled quantum well which define an intersubband resonance at Terahertz frequencies. In other embodiments, the absorbing layer contains different types of quantum wells which define intersubband transitions at Terahertz frequencies, like but not limited to those shown schematically in FIGS. 1A–D.

In the illustrated embodiment, the absorbing layer and back gate in a region excluding the contiguous region containing source, drain and back gate contacts are rendered insulating by ion implantation. In another embodiment, the absorbing layer and back-gate are removed by wet or dry etching in the region to form a mesa. The level of this removed region is then restored to nearly the height of the mesa by filling it in with an insulator like silicon nitride.

In the illustrated embodiment, the antenna is a broad-band bowtie antenna. In other embodiments, other types of antennas may be used, including those commonly called spiral, log-periodic, and dipole.

The detector may be enhanced by including an electromagnetic lens disposed on the substrate opposite the antenna to couple radiation into the detector.

Those portions of the two insulating layers and the absorbing layer which lie between the front gate and the back gate define an active region which is characterized by a DC electric field perpendicular to the plane of the wafer. The portion of the absorbing layer which lies within the active region and is connected to the source and drain contacts defines an absorbing region. The voltages on the front and back gates and on the source and drain contacts can be adjusted to independently tune the DC electric field perpendicular to the plane of the wafer at the absorbing region and the carrier concentration in the absorbing region, enabling the frequency of the intersubband absorption and resonant impedance of the active region to be varied independently. The area of the front gate, which defines the area of the active region, and the spacing between front and back gates are defined such that the impedance which the active region presents to the antenna can be matched to the impedance of the antenna.

The invention is also defined as a method of detecting THz electromagnetic radiation comprising the steps of receiving the electromagnetic radiation, and inducing an oscillating electric field in an active region corresponding to the received electromagnetic radiation. Power from the induced oscillating electric field is absorbed at a resonance frequency in the absorbing region within the active region to raise the temperature of an electron gas which is formed in this absorbing region. The rise in temperature changes the resistance of the electron gas in the absorbing region. A change in resistance of the active region is detected so to generate a signal indicative of detection of the electromagnetic radiation at the resonance frequency.

The active region has a front and back gate and further comprises the step of applying a voltage between the front and back gate to control an electric field imposed thereby in the absorbing region. The application of the voltage between the front and back gate controls the electric field imposed thereby in the absorbing region and thus controls resonant frequency of the absorbing region.

The absorbing region has a source and a drain and a carrier concentration and the method further comprises the step of controlling the carrier concentration of the absorbing region by varying the source and drain voltages relative to the front and back gate voltages. The electromagnetic radiation is received in an antenna having an impedance and control of the carrier concentration of the absorbing region comprises the step of controlling the carrier concentration to control impedance of the active region to match the impedance of the antenna.

Control of the carrier concentration to match impedance is performed independently of control the electric field to control resonant frequency and vice versa.

The invention, now having been briefly summarized, is illustrated and compared to the prior art in the following drawings wherein like numerals refer to like elements.

BRIEF DESCRIPTION OF DRAWINGS

FIG. 5b is a side cross-sectional view of the preferred embodiment of a TACIT detector of the invention as seen through section lines 5—5 of FIG. 5a.

FIGS. 6a–h shows the stages of one process for fabricating a TACIT detector from an epitaxially grown wafer. In FIG. 6a the wafer is grown. In FIG. 6b the wafer is provided with a step. In FIGS. 6c and d three ohmic contacts are deposited and annealed. In FIGS. 6e and f the wafer is provided with a gold ion-implantation mask. In FIGS. 6g and h the wafer is shown after ion-implantation and after removal of gold ion-implantation mask.

Figure 1:
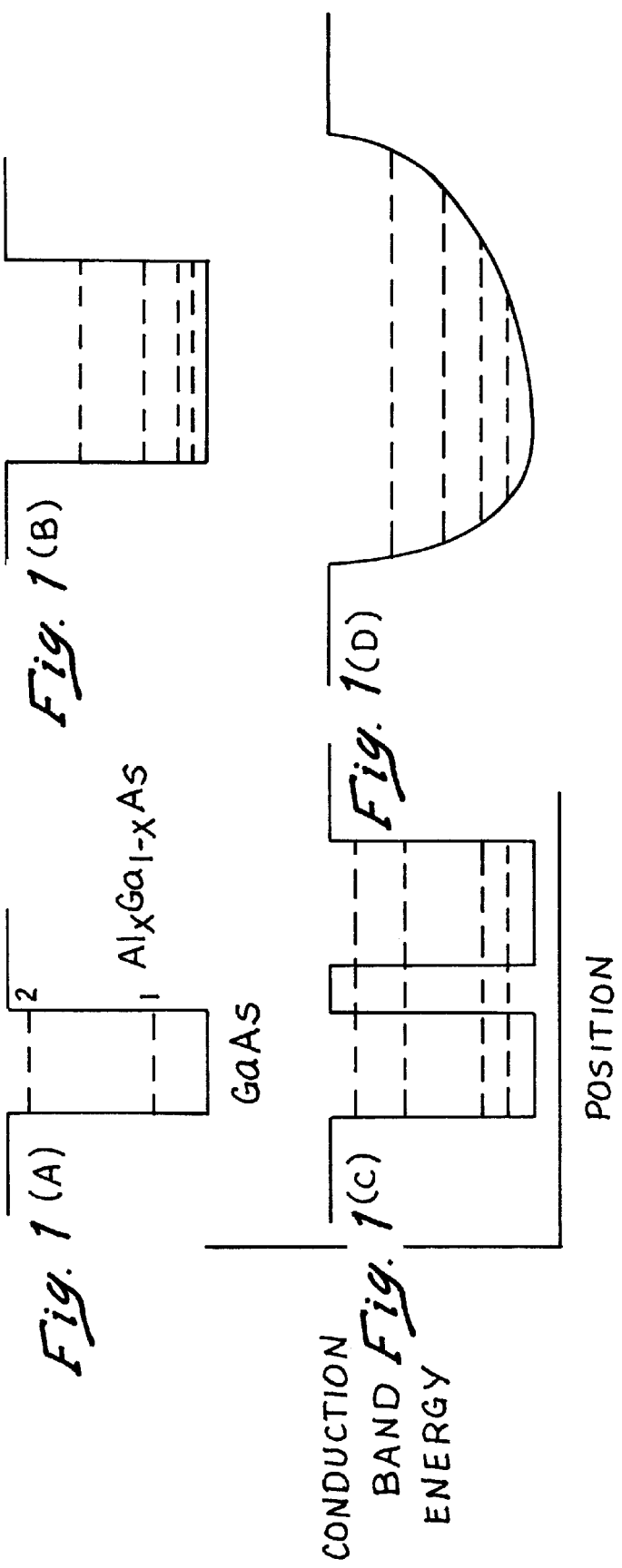
FIGS. 1A–D shows an energy band diagrams of a conduction band for four different kinds of prior art quantum wells. The dashed horizontal lines represent energies of "subbands" in these quantum wells.
Figure 2:
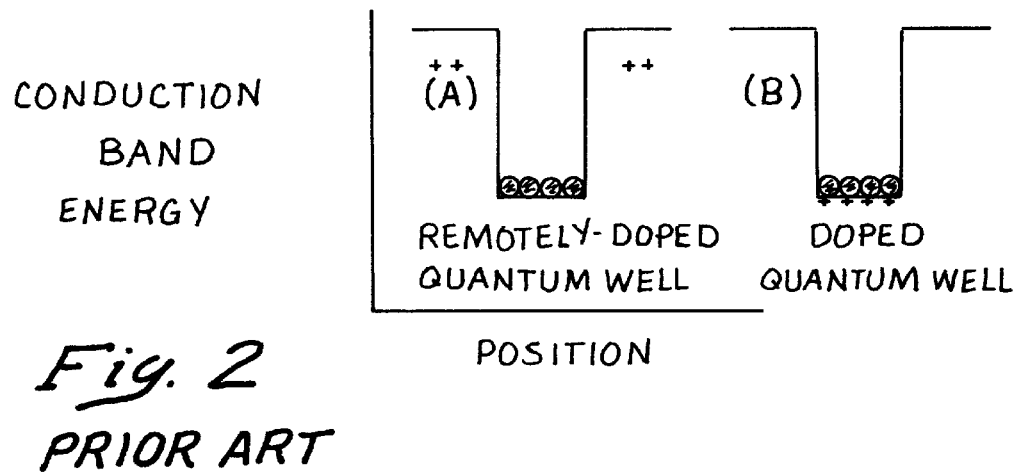
FIG. 2A shows a prior art remotely-doped quantum well and FIG. 2B shows a doped quantum well.
Figure 3:
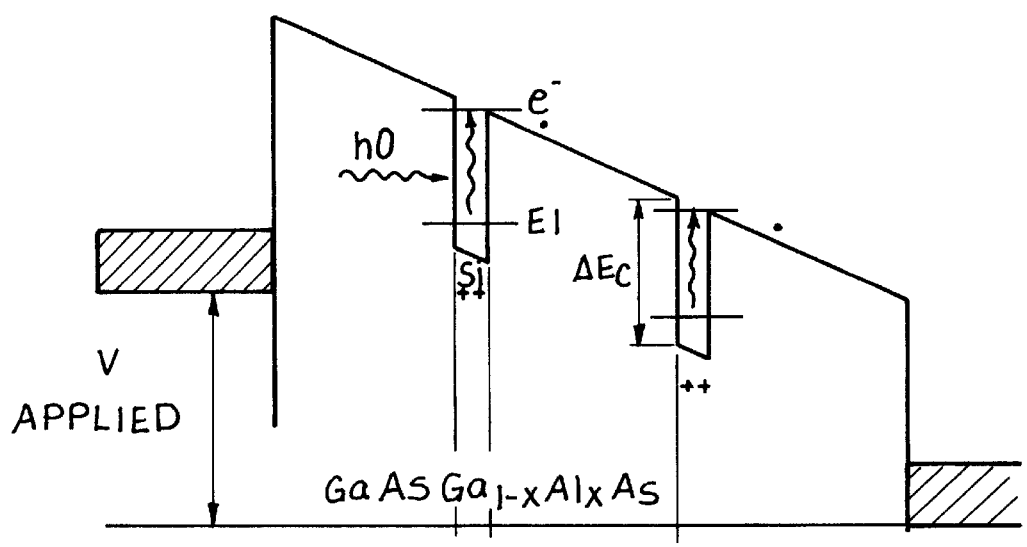
FIG. 3 shows an energy diagram of a conduction band illustrating the working of a prior art QWIP.
Figure 4:
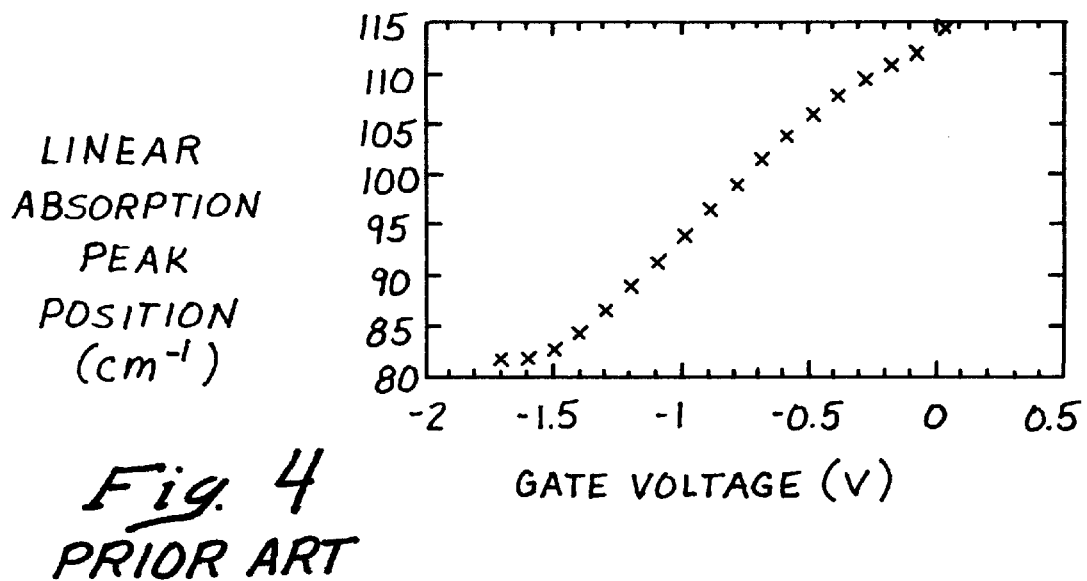
FIG. 4 is a graph having linear absorption peak position $cm^{-1}$ along the vertical axis and gate voltage on the horizontal axis illustrating the tunability of intersubband absorption in a prior art coupled quantum well.

The invention and its comparison to the prior art having been illustrated above can now be better understood by turning to the following detailed description of the illustrated embodiment.

DETAILED DESCRIPTION OF THE PREFERRED EMBODIMENTS

A tunable antenna-coupled intersubband terahertz (TACIT) detector is based on intersubband absorption in doped semiconductor quantum wells. THz-frequency radiation impinges on a coplanar antenna. One leaf of the antenna is attached to a front gate and the other to a back gate. The antenna couples radiation into the region between the gates (the "active region") with electric field perpendicular to the plane of the antenna. Radiation, which is at the intersubband absorption frequency for this two dimensional electron gas, is absorbed in the active region, heating the electron gas that is contained therein. This changes the resistance of the two-dimensional electron gas to currents flowing parallel to the plane of the antenna. The change in resistance is detected. The frequency of the absorption, and hence the detection frequency, can be tuned over the 1–5 THz range by applying small voltages between a front and back gate. The efficiency with which radiation couples from the antenna into the active 1o region can be optimized at each frequency.

TACIT detectors solve a number of outstanding problems associated with Terahertz detection including:

1. Voltage tunability eliminates the need for bulky spectrometers and interferometers in certain applications.
2. Superior combination of speed and sensitivity.
3. Relaxed cooling requirements.

The proposed TACIT detector solves or ameliorates several of the outstanding problems listed above, in particular:

(1) Bulk, weight, and complexity of spectrometers: The TACIT detector is sensitive only for frequencies near the intersubband absorption frequency. This frequency can be tuned by applying small dc voltages between the front and back gates. This electrical tunability eliminates the need for conventional spectrometers in some applications where frequency resolution is desired.

(2) Coupling efficiency: The carrier concentration in the active region can be varied independently of the intersubband absorption frequency by varying the DC voltages applied to terminals of the TACIT detector. This enables one to adjust the impedance of the active region to match the antenna's impedance at each resonance frequency and without any complicated external matching network.

(3) Overloading by background radiation: Since the TACIT detector is sensitive only in a narrow band of frequencies, it is much less susceptible to unwanted signals outside of that band than broad-band detectors.

(4) Cooling: Superconducting transition-edge bolometers must be operated in a narrow range of temperatures near the superconducting transition temperature. Composite bolometers must be cooled to lower than 1 °K. for NEP's near $10–16$ W/Hz$^{1/2}$. TACIT detectors are not restricted to very narrow temperature ranges, and calculations indicate high sensitivity even near temperatures as high as 10 K. See, M. S. Sherwin, "A Tunable Antenna-Coupled Intersubband Terahertz (TACIT) detector," (1996).

(5) Combining high speed and high sensitivity: Calculations indicate that TACIT detectors can achieve NEP's comparable to those reported by D. C.

Alsop, et.al. "Design and construction of high-sensitivity, infrared bolometers for operation at 300 mK," Applied Optics 31 (31), 6610–15 (1992), but with time constants or order 1 ns, 5 orders of magnitude shorter. Operated as a mixer, the TACIT detector can approach the quantum limit for moderate local-oscillator power.

Figure 5A:
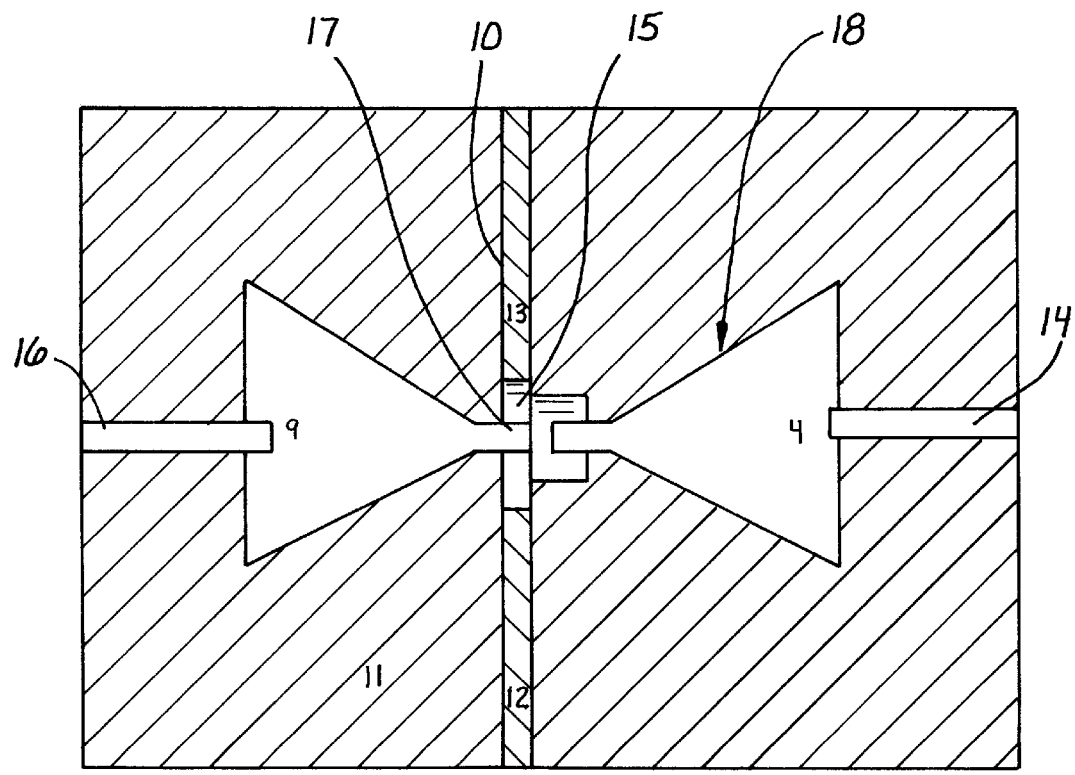
FIG. 5a is a plan elevational view of the preferred embodiment of a TACIT detector of the invention.
Figure 5B:
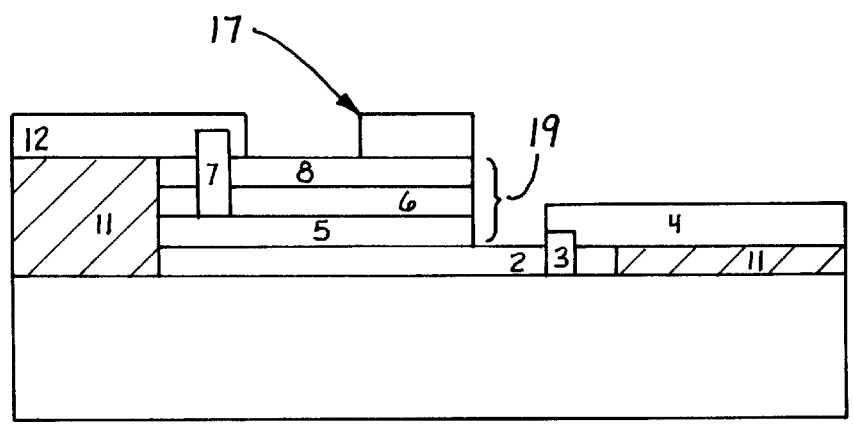

FIGS. 5a and b illustrate a preferred embodiment for the TACIT detector. FIG. 5a is a top plan view in enlarged scale of a detector and FIG. 5b is a side cross-sectional view in enlarged scale of the detector as seen through section lines 5—5 of FIG. 5a. As shown in FIG. 5b the detector is patterned onto a semiconductor wafer 100 by means of conventional photolithographic techniques on which wafer 100 the following epitaxial layers have been grown:

a. An insulating substrate 1, e.g. semi-insulating GaAs.

b. A doped conducting layer or backgate 2 is disposed onto substrate 1. This layer may be either a layer of uniformly doped semiconductor, for example 1000 A of n+GaAs, or a remotely-doped quantum well.

c. An insulating layer 5, e.g. nominally undoped $Al_xGa_{1-x}As$, is disposed onto backgate 2.

d. A doped absorbing and conducting layer 6 is disposed onto insulating layer 5. Layer 6 is a semiconductor quantum well which is doped, either remotely or in the well. The spacing between quantized subbands, which determines the frequency at which radiation is resonantly absorbed, is designed to be in the Terahertz frequency range. The intersubband spacing can be tuned by applying a DC electric field perpendicular to the plane of the wafer 100.

e. An insulating layer 8, e.g. nominally undoped $Al_xGa_{1-x}As$, is disposed onto layer 6.

Wafer 10 is patterned as follows. The doped absorbing layer 6 is rendered insulating or removed over the entire wafer 100 as denoted by cross-hatched region 11, except in a narrow strip connecting two ohmic contacts 7 and 10, hereafter called "source" and "drain". Back gate layer 2 is rendered insulating or removed as denoted by cross-hatched region 11, everywhere except underneath a narrow strip 15 connecting source 7 and drain 3, and underneath an ohmic contact 3 to the back-gate 2. One leaf 4 of a broad-band antenna 18 is evaporated onto backgate contact 3. The second leaf 9 of the antenna is evaporated such that its tip lies on top of the insulating layer 8 in narrow strip 15 connecting source 7 and drain 10. This leaf 9 of antenna 18 forms a Schottky contact with the insulating layer 8 which serves as a "front gate 17." The region between the front and back gates 17 and 2 on narrow strip 15 connecting contacts source 7 and drain 10 is called the "active region 19." The portion of the absorbing layer 6 which is contained in the active region 19 is called the "absorbing region 23." Metal strips 14 and 16 shown in FIG. 5a are evaporated to connect source 7 and drain 10 to external sources of dc voltage, amplifiers, and other circuitry (not shown) to bias the absorbing region and monitor changes in its resistance which arise from receiving Terahertz electromagnetic radiation. Metal strips 14 and 16 are connected to the antenna leaves 4 and 9 respectively to connect front gate 17 and back-gate 4 to external sources of dc voltage (not shown).

Figure 6B:
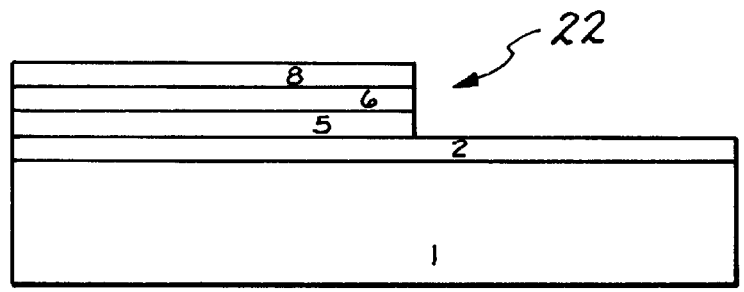
Figure 6A:
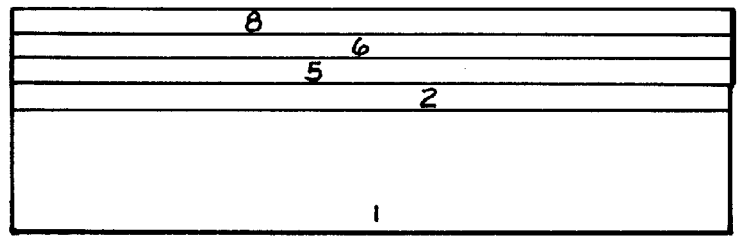
Figure 6C:
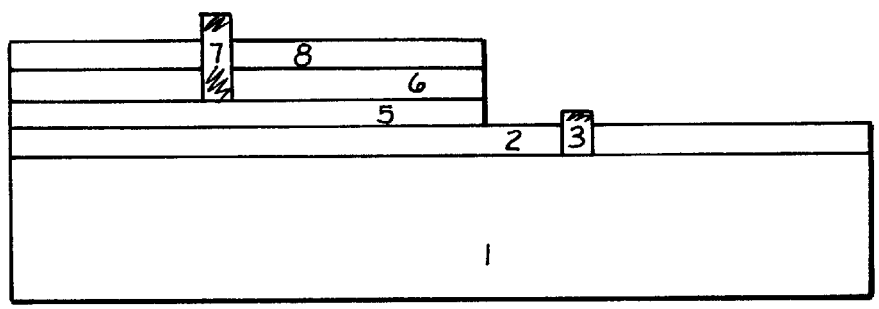
Figure 6D:
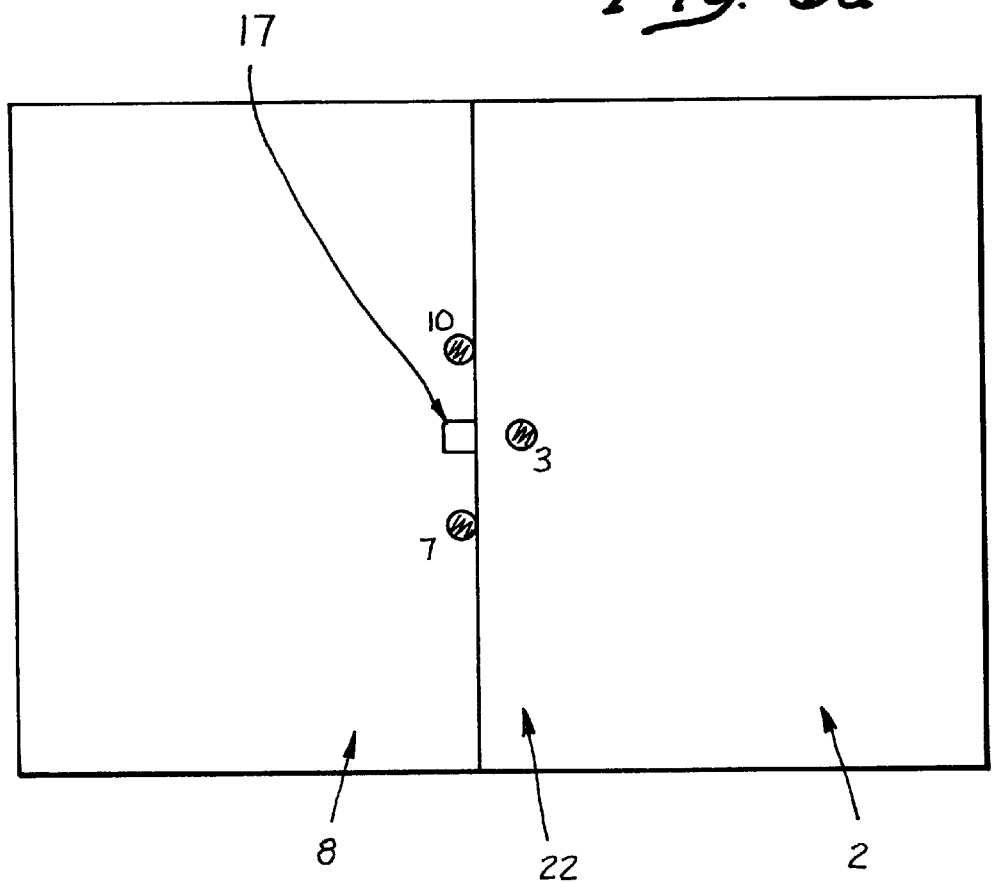

The fabrication steps of the TACIT detector is diagrammatically depicted in FIGS. 6a–e. As shown in the side cross-sectional view of FIG. 6a substrate 1 is provided with epitaxial conductive layer 2, insulating layer 5, absorbing layer 6, and insulating layer 8 as described above. In the step shown in the side cross-sectional view of FIG. 6*b* a step 22 is defined by selective removal of a portion of layers 5, 6, and 8 to expose backgate layer 2. In the step shown in the side cross-sectional view of FIG. 6*c* ohmic contacts 3, 7 and 10 are then selectively defined and disposed to provide the electrical contacts to backgate layer 2, and source and drain regions of absorbing layer 6. FIG. 6*d* is a plan elevational view of the side cross-sectional view in reduced scale of FIG. 6*c* and shows both source and drain contacts 7 and 10 and their spatial relationship to contact 3. The intersection of strip 15 with front gate 17 is shown in dotted outline to indicate what area in plan elevational view will become active region 19. In FIGS. 6*e* and *f* an ion implantation mask 20 composed of gold or another conductive material is selectively disposed on layers 2 and 8 over contacts 3, 7 and 10 to define what will remain the conductive areas of the TACIT detector. FIG. 6*e* shows the side cross-sectional view of mask 20 while FIG. 6*f* shows its plan elevational view in reduced scale.

The ion or proton implantation or bombardment damages the epitaxial layers rendering them nonconductive. The means by which such damage is created and the thickness need for mask 20 are conventional and well known in the art. The result is that exposed portions of layers 2, 5, 6, and 8 are converted into a nonconducting layer 11. This leaves the stepped conductive area as shown in side cross-sectional view of FIG. 6*g* and in plan elevational view in reduce scale of FIG. 6*h*. TACIT detector is then completed as shown in FIGS. 5*a* and *b* with the selective addition of antenna leaves 4 and 9, leads 14 and 16 coupled respectively to leaves 4 and 9, and leads 12 and 13 coupled respectively to source and drain contacts 7 and 10.

Figure 7:
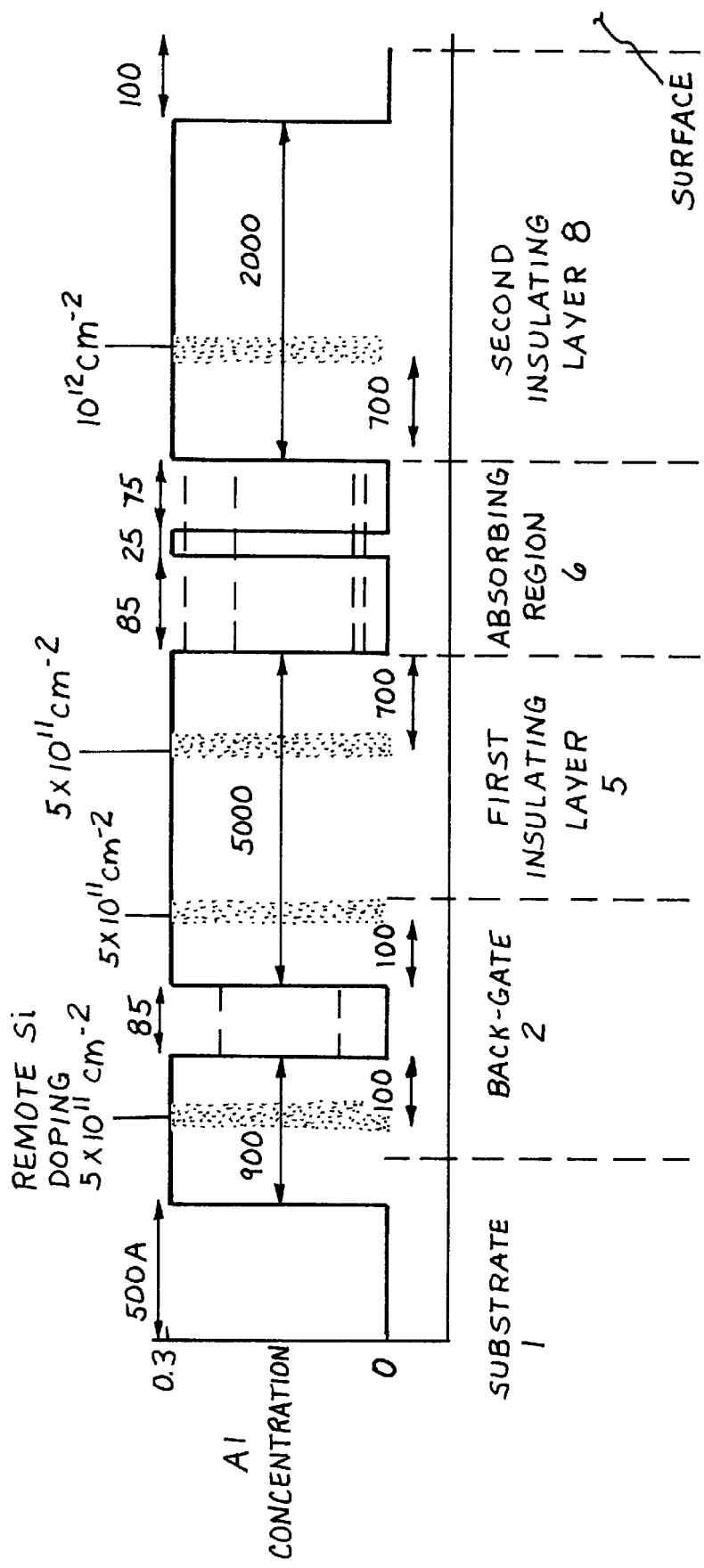
FIG. 7 shows the detail of the epitaxial layers for a TACIT detector fabricated to according to FIGS. 6a–e with a remotely-doped quantum well back-gate, and an absorbing region consisting of a remotely-doped coupled quantum well.

FIG. 7 is an energy diagram illustrating the Al doping concentrations and estimated conduction band energies in layers 1, 2, 5, 6, and 8, their concentrations and positions in the TACIT detector of FIGS. 5*a*–*b* fabricated according to the method of FIGS. 6*a*–*h* as seen through section lines 5—5 of FIG. 5*b*. Remote silicon doping is indicated by the stippled areas. The horizontal axis of FIG. 7 is the distance in Angstroms along section lines 5—5 of FIG. 5*b* starting from substrate 1 on the left and ending with insulating layer 8 on the right. The dashed lines in FIG. 7 represent the energy levels of charge carriers in the back gate quantum well and absorbing layer quantum well. The vertical axis is also representative of the Al concentration.

The principle of operation of the TACIT detector is as follows. Electromagnetic radiation impinges on the broadband antenna 18. This electromagnetic radiation induces an oscillating electric field in active region 19. If the frequency of the oscillating electric field matches the resonance frequency of the absorbing region 23, power is absorbed, and heats up the electron gas in absorbing region 23. The mobility of this electron gas in the absorbing region 23 changes with increasing electron temperature, causing the resistance of strip 15 to change. This change in resistance is sensed by measuring a change in the voltage (or current) induced by a current (or voltage respectively) between source 7 and drain 10.

The carrier concentration in absorbing region 23 can be controlled by the field effect, induced by varying the potential of absorbing region 23, namely the average of the voltages on source 7 and drain10, with respect to the potentials applied to the front and back gates 17 and 2 across active region 19. The static electric field which is perpendicular to the plane of wafer 110 in active region 19 can be varied by varying the potential difference between front and back gates 17 and 2. The resonance frequency and Terahertz impedance of active region 19 can be varied independently by independently varying the carrier concentration and DC electric field in active region 19. To maximize coupling efficiency, the impedance presented to antenna 18 by active region 19 should match the antenna impedance which is typically 50–200 Ohms.

TACIT detector 100 can be used as a mixer by coupling a monochromatic source of THz radiation as a conventional local oscillator (LO) (not shown) into active region 19 via antenna leaves 4 and 9. Time-dependent currents or voltages at the intermediate frequency, which is the difference between the LO and signal frequencies, are measured across source 7 and drain 10.

Figure 9:
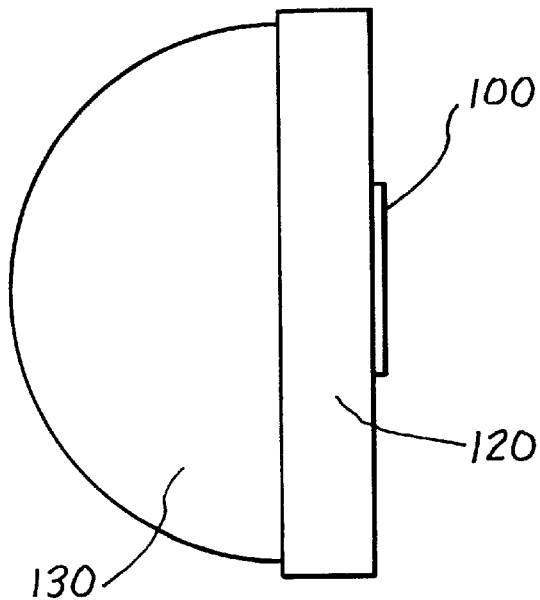
FIG. 9 shows a TACIT detector with a lens disposed over the substrate opposite the TACIT detector to enhance coupling of THz radiation into the TACIT detector.

FIG. 9 is a simplified diagrammatic side elevational view of TACIT detector 100 as described above shown as mounted to a THz transparent substrate 120 on the back of which is a conventional THz lens 130 which serves to collect and focus the THz radiation into TACIT detector 100. Thus lens 130 collects and focusses the radiation into antenna 13.

Antenna 18 can be thought of as a transmission line with a characteristic impedance which is terminated by a load which is the impedance of active region 19. If the impedance of active region 19 matches the impedance of antenna 18, all of the radiation coupled from free space into antenna 18 will be coupled from antenna 18 into active region 19. If the impedance of active region 19 does not match that of antenna 18, then some of the radiation will be reflected back into antenna 18, and the remaining radiation will be absorbed. Consider now only the case of Terahertz radiation whose frequency matches the frequency of the intersubband absorption. In this case, the electrons in active region 19 present a purely resistive load on antenna 18. For maximum sensitivity, the impedance (resistance, in this case) of that load must match the impedance of antenna 18. To a first approximation, the impedance presented to antenna 18 by the electrons in active region 19 is proportional to the number of carriers in absorbing region 23 . This can be adjusted by varying the potential of absorbing region 23 (average of voltages on source 7 and drain 10) relative to the voltages on front and back gates 17 and 2.

To a first approximation, for an active region containing an asymmetric quantum well like those shown in FIGS. 1C and D and in FIG. 7, the resonant frequency of electrons in this active region 19 is simply proportional to the D.C. electric field perpendicular to the wafer in the active region. This DC electric field can be varied by adjusting the voltage difference between front and back gates 17 and 2. Since the voltage difference between back and front gates 17 and 2 can be adjusted independently from the average voltage between source 7 and drain 10, the impedance presented by active region 19 to antenna 18 can be adjusted independently from the resonant frequency.

Figure 8:
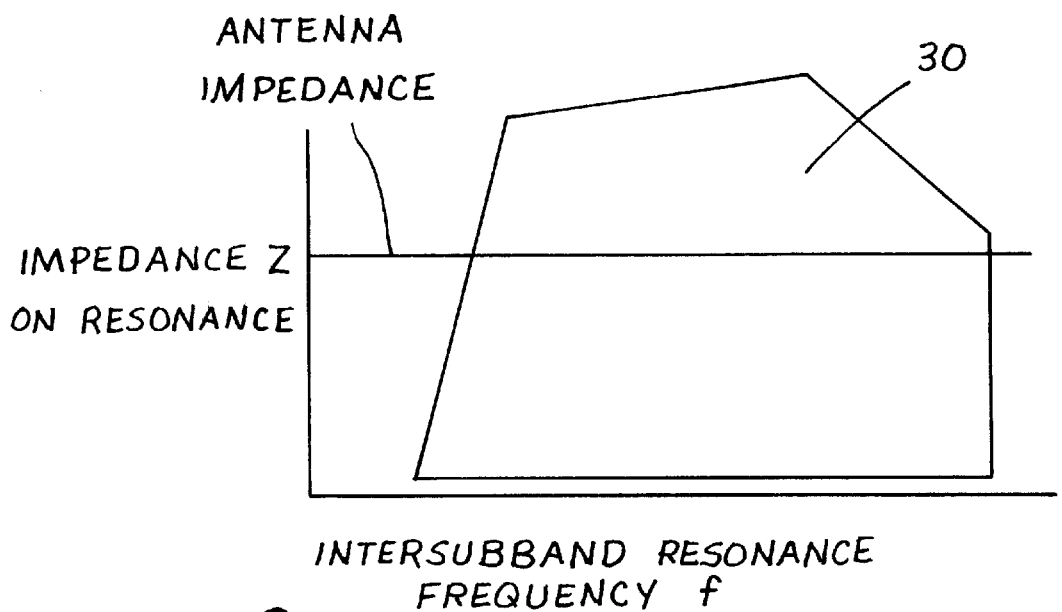
FIG. 8 qualitatively shows that a region containing a continuously varying set of values of the intersubband resonance frequency and impedance on resonance can be accessed by varying the voltages on the four terminals of a TACIT detector of FIGS. 5a–7. The TACIT detector will operate optimally at those combinations of voltages for which the impedance on resonance matches the impedance of the antenna shown by the horizontal straight line.

The domain 30 of intersubband resonance frequency, f, and impedance of resonance, Z, which can be realized by independent adjustment of the front-to-back gate voltages and the average source-to-drain voltage is qualitatively illustrated in FIG. 8 wherein the shaded region indicates the space of (f, Z) pairs that are accessible. The impedance of the antenna is depicted symbolically by the horizontal line drawn through domain 30. It is to be understood that the exact shape and ranges will depend on the specific implementation of the TACIT detector.

In a more exact analysis of the TACIT detector, both the resonance frequency and impedance presented to the antenna by the active region depend on both the carrier concentration in the active region and the dc electric field across it. Thus, in order to adjust the resonant frequency of the active region while holding the impedance of the active region at a constant value matched to the impedance of the antenna, it will be necessary to simultaneously adjust both the voltage difference between back and front gates 17 and 2 and the average of voltages on source 7 and drain 10 with respect to the voltages on front and back gates. Calculations show that this can be accomplished for prior art quantum wells. See, "A Tunable Antenna-Coupled Intersubband Terahertz (TACIT) detector," (1996).

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

I claim:

1. A detector of electromagnetic radiation comprising:

an insulating semiconductor substrate;

a conducting back gate disposed on said insulating semiconductor substrate and having a back gate contact;

an antenna for receiving said electromagnetic radiation and having at least two leaves, said back gate coupled by said ohmic contact to one of said two leaves of said antenna;

a first insulating layer disposed on said back gate;

an absorbing layer disposed on said first insulating layer;

a source contact and a drain contact coupled to said absorbing layer;

a second insulating layer disposed on said absorbing layer;

a front gate disposed on said second insulating layer, said front gate coupled to a second one of said two leaves of said antenna and disposed between source and drain contacts, whereby a tunable antenna-coupled intersubband TeraHertz detector is provided.

2. The detector of claim 1 wherein said absorbing layer has a resonant frequency and wherein said back gate comprises a remotely-doped quantum well with an intersubband absorption frequency large compared to the resonant frequency in said absorbing layer.

3. The detector of claim 1 wherein said back gate is a doped layer of semiconductor.

4. The detector of claim 1 wherein said back gate is rendered insulating everywhere except in a contiguous region containing said back gate, source and drain contacts.

5. The detector of claim 1 wherein said back gate layer is removed by etching everywhere except in a contiguous region containing said back-gate, source and drain contacts.

6. The detector of claim 1 wherein said absorbing layer is a remotely-doped quantum well with a well-defined intersubband resonance, said quantum well being comprised of at least one layer of semiconductor with a low or graded band gap and where said adjacent first and second insulating layers have a higher band gap, such that an intersubband resonance is defined.

7. The detector of claim 1 wherein said absorbing layer comprises a doped quantum well with an intersubband resonance.

8. The detector of claim 1 wherein said absorbing layer is rendered insulating or etched away everywhere except in a narrow strip in which said source and drain contacts.

9. The detector of claim 1 wherein said first insulating layer is an epitaxial layer which is insulating by virtue of not being intentionally doped.

10. The detector of claim 1 wherein said first insulating layer is composed of a layer of GaAs semiconductor grown near 200° C. and then annealed near 600° C., which is insulating by virtue of a high concentration of precipitates.

11. The detector of claim 1 wherein said antenna is a resonant antenna.

12. The detector of claim 1 wherein said antenna is a broadband antenna.

13. The detector of claim 1 wherein an electromagnetic lens is disposed on said substrate opposite said antenna to couple radiation into said detector.

14. The detector of claim 1 wherein said front gate and back gate are separated by a distance, and define an active region between said front gate and back gate having a carrier concentration therein, said active region having an area, said area of said active region being chosen such that voltages on said front and back gates, and on said source and drain contacts are adjusted to independently tune said carrier concentration and to define a DC electric field across said active region enabling the frequency of the intersubband absorption and resonant impedance in said active region to be varied independently, so that impedance of said antenna can be matched by that of said absorbing layer.

15. A method of detecting THz electromagnetic radiation comprising:

receiving said electromagnetic radiation;

inducing an oscillating electric field in an active region corresponding to said received electromagnetic radiation;

absorbing power from said induced oscillating electric field at a resonance frequency in an absorbing region contained within said active region, wherein said absorbing region has an area and thickness; and detecting a change in resistance of said absorbing region so to generate a signal indicative of detection of said electromagnetic radiation at said resonance frequency, wherein said absorbing region has a carrier concentration and further comprising controlling said carrier concentration of said absorbing region, and wherein said electromagnetic radiation is received in an antenna having an impedance and wherein controlling said carrier concentration of said absorbing region comprises controlling said carrier concentration to control impedance of said absorbing region to match said impedance of said antenna by selecting said area or thickness or both of said absorbing region.

16. A method of detecting THz electromagnetic radiation comprising:

receiving said electromagnetic radiation;

inducing an oscillating electric field in an active region corresponding to said received electromagnetic radiation;

absorbing power from said induced oscillating electric field at a resonance frequency in an absorbing region contained within said active region to change the resistance of an electron gas in said absorbing region; and detecting a change in resistance of said absorbing region so to generate a signal indicative of detection of said electromagnetic radiation at said resonance frequency, wherein said active region has a front gate and back gate coupled to said active region and further comprising applying a voltage between said front gate and back gate to control an electric field imposed thereby in said absorbing region.

17. The method of claim 16 wherein application of said voltage between said front gate and back gate to control said electric field imposed thereby in said absorbing region controls resonant frequency of said absorbing region.

18. The method of claim 17 wherein said absorbing region has a carrier concentration and further comprising controlling said carrier concentration of said absorbing region, wherein said electromagnetic radiation is received in an antenna having an impedance and wherein controlling said carrier concentration of said absorbing region comprises controlling said carrier concentration to control impedance of said absorbing region to match said impedance of said antenna, control of said carrier concentration to match impedance being performed independently of control said electric field to control resonant frequency and vice versa.

* * * * *